United States Patent
Takenaka et al.

(10) Patent No.: US 7,671,655 B2
(45) Date of Patent: Mar. 2, 2010

(54) LEVEL CONVERSION CIRCUIT FOR A SEMICONDUCTOR CIRCUIT

(75) Inventors: Kyoichi Takenaka, Yokohama (JP); Takashi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 11/937,049

(22) Filed: Nov. 8, 2007

(65) Prior Publication Data
US 2008/0111610 A1    May 15, 2008

(30) Foreign Application Priority Data
Nov. 9, 2006  (JP) .............. 2006-304393

(51) Int. Cl.
*H03L 5/00* (2006.01)
(52) U.S. Cl. ............... 327/333; 326/81
(58) Field of Classification Search ............... 327/333; 326/81
See application file for complete search history.

(56) References Cited

U.S. PATENT DOCUMENTS

| | | | |
|---|---|---|---|
| 5,399,915 A * | 3/1995 | Yahata ............... | 327/108 |
| 5,723,986 A * | 3/1998 | Nakashiro et al. ............. | 326/81 |
| 5,751,177 A * | 5/1998 | Tanoi ............... | 327/333 |
| 5,872,476 A | 2/1999 | Mihara et al. | |
| 6,242,962 B1 | 6/2001 | Nakamura | |
| 6,801,181 B2 | 10/2004 | Matsumoto et al. | |

FOREIGN PATENT DOCUMENTS

JP          11-088147          3/1999

* cited by examiner

*Primary Examiner*—Lincoln Donovan
*Assistant Examiner*—John W Poos
(74) *Attorney, Agent, or Firm*—Turocy & Watson, LLP

(57) ABSTRACT

A level conversion circuit includes a high-potential-side level conversion unit which is connected between a first high-voltage power supply and a first low-voltage power supply, and converts a high-potential-side voltage of an input signal, a low-potential-side level conversion unit which is connected between a second high-voltage power supply with a lower voltage than the first high-voltage power supply and a second low-voltage power supply with a lower voltage than the first low-voltage power supply, and converts a low-potential-side voltage of the input signal, and an output unit to which an output of the high-potential-side level conversion unit and an output of the low-potential-side level conversion unit are input, and which outputs a voltage level of the first high-voltage power supply and a voltage level of the second low-voltage power supply.

10 Claims, 7 Drawing Sheets

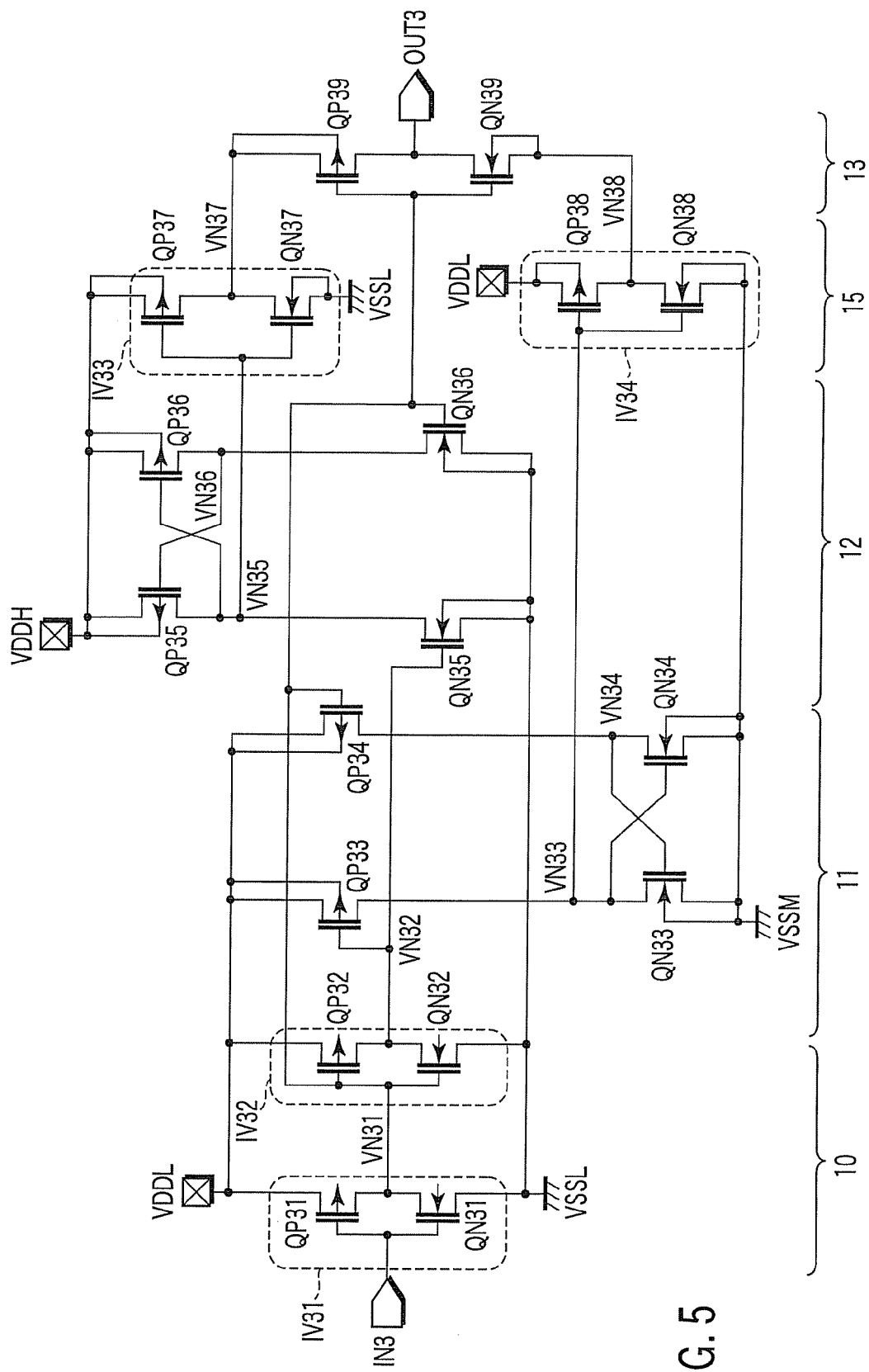
F I G. 5

Level conversion circuit (comparative example)

LEVEL CONVERSION CIRCUIT FOR A SEMICONDUCTOR CIRCUIT

CROSS-REFERENCE TO RELATED APPLICATIONS

This application is based upon and claims the benefit of priority from prior Japanese Patent Application No. 2006-304393, filed Nov. 9, 2006, the entire contents of which are incorporated herein by reference.

BACKGROUND OF THE INVENTION

1. Field of the Invention

The present invention relates to a level conversion circuit, and is applied, for example, to a level conversion circuit of a semiconductor circuit.

2. Description of the Related Art

In the prior art, for example, a level conversion circuit, which is applied to a semiconductor circuit, is configured to have only a positive-side level conversion unit. Thus, in the conventional level conversion circuit, level conversion of only a positive-side output level, relative to an input level, is executed, and a negative-side output level is a ground voltage (VSSL). As a result, there is a tendency that an output voltage difference of the level conversion circuit is small.

In addition, the conventional level conversion circuit is configured such that a maximum output potential difference between a positive level and a negative level (i.e. high power supply voltage VDDH−ground voltage VSSL) is constantly applied across a current path of an output transistor. Consequently, in the case where the output transistor is fabricated by the same fabrication process as other transistors that constitute the level conversion unit, etc., an output amplitude, which is greater than a breakdown voltage across the current path of the transistor, cannot be obtained. The reason is that the breakdown voltage across the current path of the output transistor is determined by the fabrication process.

On the other hand, in order to perform large-amplitude output voltage conversion, it is necessary to increase the breakdown voltage of only the output transistor, thereby to withstand the large-amplitude output voltage that is applied to the output transistor. In this case, however, a fabrication process for increasing the breakdown voltage of only the output transistor is additionally required, leading to an increase in the number of fabrication steps and in manufacturing cost.

As described above, in the conventional level conversion circuit, if the output voltage difference is to be improved, there is a tendency that an overvoltage, which is higher than the breakdown voltage, is applied to the transistor that constitutes the output unit.

Jpn. Pat. Appln. KOKAI Publication No. 11-88147 is an example of documents relating to the present invention. Jpn. Pat. Appln. KOKAI Publication No. 11-88147 discloses an example in which a MOS transistor with a high breakdown voltage is made needless by lowering a voltage which is applied to the MOS transistor that is used.

BRIEF SUMMARY OF THE INVENTION

According to another aspect of the present invention, there is provided a level conversion circuit comprising: a high-potential-side level conversion unit which is connected between a first high-voltage power supply and a first low-voltage power supply, and converts a high-potential-side voltage of an input signal; a low-potential-side level conversion unit which is connected between a second high-voltage power supply with a lower voltage than the first high-voltage power supply and a second low-voltage power supply with a lower voltage than the first low-voltage power supply, and converts a low-potential-side voltage of the input signal; a first load-reducing unit which outputs a voltage level of the first high-voltage power supply or a voltage level of the first low-voltage power supply on the basis of an output of the high-potential-side level conversion unit; a second load-reducing unit which outputs a voltage level of the second high-voltage power supply or a voltage level of the second low-voltage power supply on the basis of an output of the low-potential-side level conversion unit; and an output unit to which an output of the first load-reducing unit and an output of the second load-reducing unit are input, and which outputs the voltage level of the first high-voltage power supply and the voltage level of the second low-voltage power supply, the output unit comprises a first transistor of a first conductivity type and a second transistor of a second conductivity type, current paths of the first transistor and the second transistor being connected in series between the first load-reducing unit and the second load-reducing unit.

According to another aspect of the present invention, there is provided a level conversion circuit comprising: a high-potential-side level conversion unit which is connected between a first high-voltage power supply and a first low-voltage power supply, and converts a high-potential-side voltage of an input signal; a low-potential-side level conversion unit which is connected between a second high-voltage power supply with a lower voltage than the first high-voltage power supply and a second low-voltage power supply with a lower voltage than the first low-voltage power supply, and converts a low-potential-side voltage of the input signal: a first load-reducing unit which outputs a voltage level of the first high-voltage power supply or a voltage level of the first low-voltage power supply on the basis of an output of the high-potential-side level conversion unit; a second load-reducing unit which outputs a voltage level of the second high-voltage power supply or a voltage level of the second low-voltage power supply on the basis of an output of the low-potential-side level conversion unit; and an output unit to which an output of the first load-reducing unit and an output of the second load-reducing unit are input, and which outputs the voltage level of the first high-voltage power supply and the voltage level of the second low-voltage power supply, wherein the second load-reducing unit comprises a first transistor of a first conductivity type and a second transistor of a second conductivity type, current paths of the first transistor and the second transistor being connected in series between the second high-voltage power supply and the second low-voltage power supply.

According to still another aspect of the present invention, there is provided a level conversion circuit comprising: a high-potential-side level conversion unit which is connected between a first high-voltage power supply and a first low-voltage power supply, and converts a high-potential-side voltage of an input signal; a low-potential-side level conversion unit which is connected between a second high-voltage power supply with a lower voltage than the first high-voltage power supply and a second low-voltage power supply with a lower voltage than the first low-voltage power supply, and converts a low-potential-side voltage of the input signal; a first load-reducing unit which outputs a voltage level of the first high-voltage power supply or a voltage level of the first low-voltage power supply on the basis of an output of the high-potential-side level conversion unit; a second load-reducing unit which outputs a voltage level of the second high-voltage power supply or a voltage level of the second low-voltage power supply on the basis of an output of the low-potential-side level conversion unit; and an output unit to which an output of the first load-reducing unit and an output of the second load-reducing unit are input, and which outputs the voltage level of the first high-voltage power supply and the voltage level of the second low-voltage power supply, wherein the second load-reducing unit comprises a first transistor of a first conductivity type and a second transistor of a second conductivity type, current paths of the first transistor and the second transistor being connected in series between the second high-voltage power supply and the second low-voltage power supply, wherein the second load-reducing unit comprises a first transistor of a first conductivity type and a second transistor of a second conductivity type, current paths of the first transistor and the second transistor being connected in series between the second high-voltage power supply and the second low-voltage power supply.

BRIEF DESCRIPTION OF THE SEVERAL VIEWS OF THE DRAWING

FIG. 5 is a circuit diagram showing a level conversion circuit according to a third embodiment of the present invention;

DETAILED DESCRIPTION OF THE INVENTION

Figure 1:
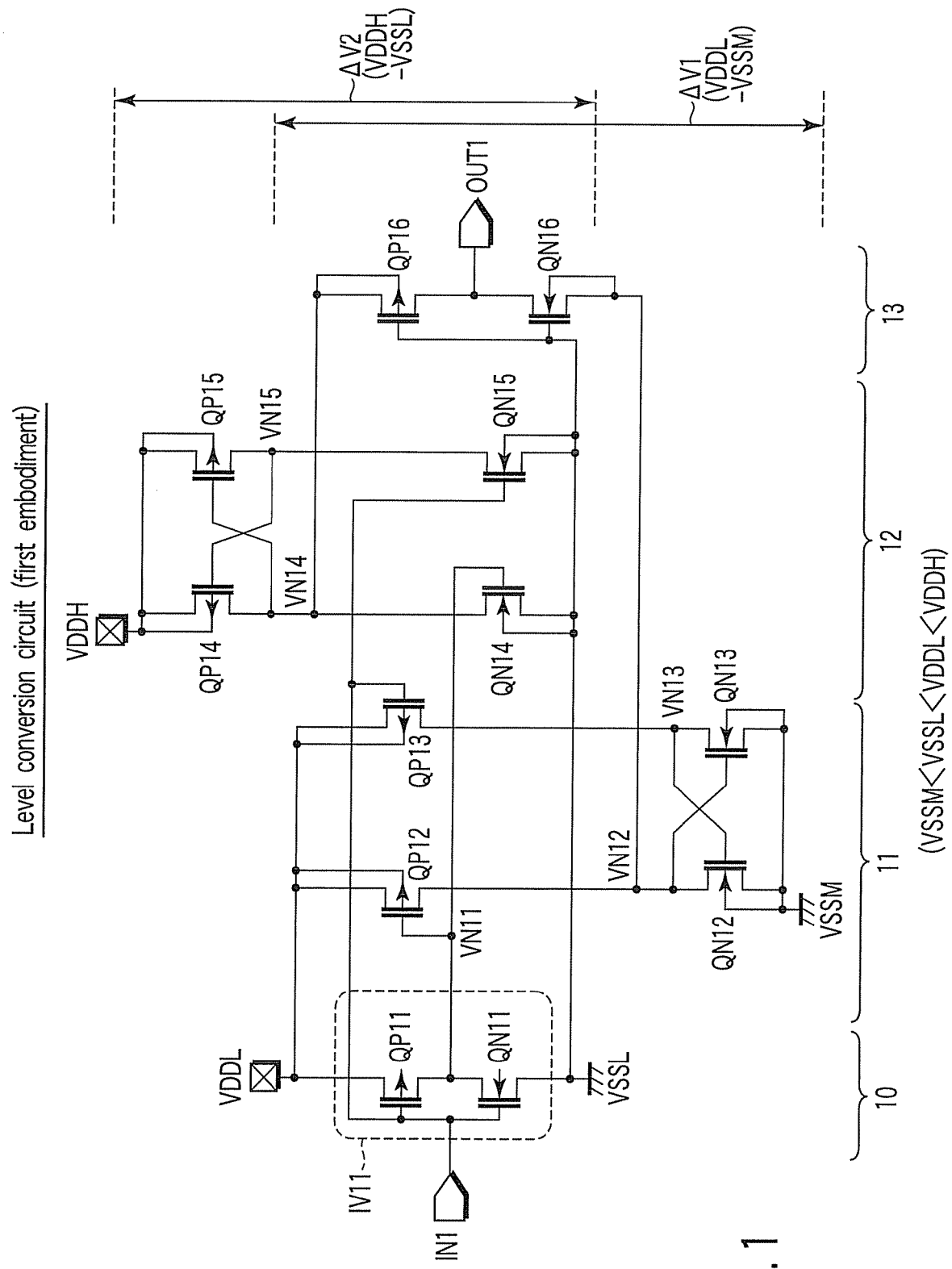
FIG. 1 is a circuit diagram showing a level conversion circuit according to a first embodiment of the present invention.

Embodiments of the present invention will now be described with reference to the accompanying drawings. In the description below, common parts are denoted by like reference numerals throughout the drawings.

First Embodiment

Figure 2:
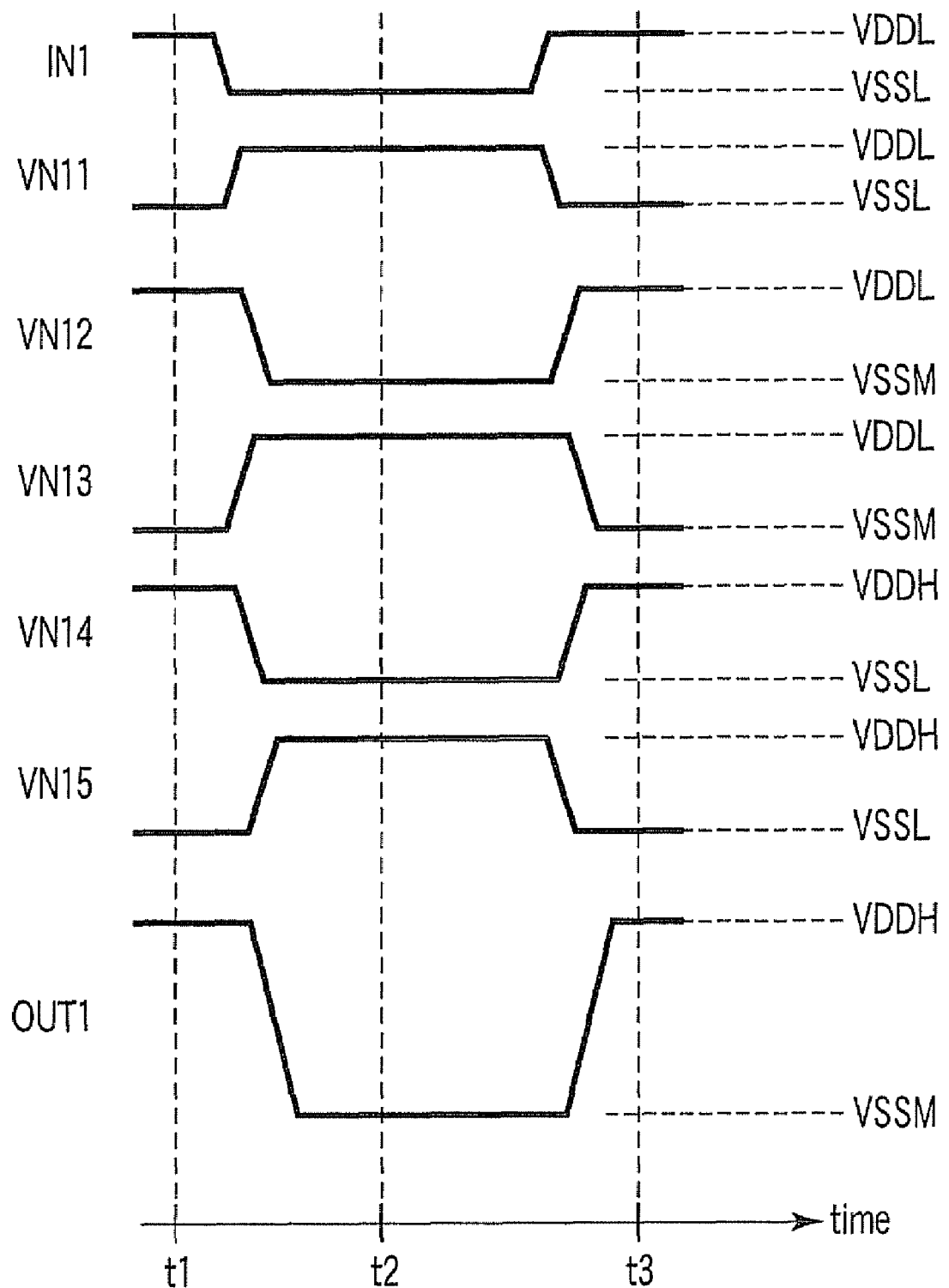
FIG. 2 is an operational waveform diagram illustrating the operation of the level conversion circuit according to the first embodiment.

To begin with, referring to FIG. 1 and FIG. 2, a description is given of a level conversion circuit according to a first embodiment of the present invention. FIG. 1 is a circuit diagram showing the level conversion circuit according to this embodiment.

<Example of Structure>

An example of the structure of the level conversion circuit according to this embodiment is described with reference to FIG. 1.

As shown in FIG. 1, the level conversion circuit according to the first embodiment includes an input unit 10, a negative-side level conversion unit 11, a positive-side level conversion unit 12 and an output unit 13.

The input unit 10 is composed of an inverter IV11 which includes a P-type MOS transistor QP11 and an N-type MOS transistor QN11 and is operated by a low-voltage power supply VDDL.

The inverter IV11 is configured such that source-drain paths of the P-type MOS transistor QP11 and N-type MOS transistor QN11 are connected in series between the low-voltage power supply VDDL and a ground power supply VSSL. An input signal IN1 is input to the gates of the P-type MOS transistor QP11 and an N-type MOS transistor QN11.

The negative-side level conversion unit 11 is composed of two P-type MOS transistors QP12 and QP13 and two N-type MOS transistors QN12 and QN13.

The MOS transistors QP12 and QN12 have source-drain paths connected in series between the low-voltage power supply VDDL and a ground power supply VSSM having a lower voltage level than the ground power supply VSSL. The gate of the N-type MOS transistor QN12 is connected to an internal node VN13 which is a connection node between the drain of the P-type MOS transistor QP13 and the drain of the N-type MOS transistor QN13. The gate of the N-type MOS transistor QN13 is connected to an internal node VN12 which is a connection node between the drain of the P-type MOS transistor QP12 and the drain of the N-type MOS transistor QN12.

Similarly, the P-type MOS transistor QP13 and N-type MOS transistor QN13 have source-drain paths connected in series between the low-voltage power supply VDDL and the ground power supply VSSM.

The positive-side level conversion unit 12 is composed of two P-type MOS transistors QP14 and QP15 and two N-type MOS transistors QN14 and QN15.

The MOS transistors QP14 and QN14 have source-drain paths connected in series between the high-voltage power supply VDDH and ground power supply VSSL. The gate of the P-type MOS transistor QP14 is connected to an internal node VN15 which is a connection node between the drain of the P-type MOS transistor QP15 and the drain of the N-type MOS transistor QN15. The gate of the P-type MOS transistor QP15 is connected to an internal node VN14 which is a connection node between the drain of the P-type MOS transistor QP14 and the drain of the N-type MOS transistor QN14.

Similarly, the MOS transistors QP15 and QN15 have source-drain paths connected in series between the high-voltage power supply VDDH and ground power supply VSSL.

The output unit 13 is composed of a P-type MOS transistor QP16 and an N-type MOS transistor QN16.

The output unit 13 is configured such that the source-drain paths of the MOS transistors QP16 and QN16 are connected in series between the internal node VN14 and internal node VN12. The gates of the MOS transistors QP16 and QN16 are commonly connected to the ground power supply VSSL. The substrate electrode of the P-type MOS transistor QP16 is connected to the source of the P-type MOS transistor QP16 itself. The substrate electrode of the N-type MOS transistor QN16 is connected to the source of the N-type MOS transistor QN16 itself. The connection node between the drains of the MOS transistors QP16 and QN16 is connected to an output terminal OUT1.

In the case of this embodiment, the voltage levels of the respective power supplies have the following relationship.

Voltage levels: the level of ground power supply VSSM<the level of ground power supply VSSL<the level of low-voltage power supply VDDL<the level of high-voltage power supply VDDH.

In addition, in this embodiment, even in the case where the level of high-voltage power supply VDDH<the level of low-voltage power supply VDDL, the level conversion circuit is operable.

<Operation>

Next, the operation of the level conversion circuit according to the present embodiment is described with reference to FIG. 2. FIG. 2 shows operational waveforms in the level conversion circuit according to this embodiment.

(Time Point t1)

As shown in FIG. 2, at time point t1, an input signal IN1 is at high level (level of low-voltage power supply VDDL).

At this time, the MOS transistor QP13 is in the OFF state, the output of the inverter IV11 is at low level (level of ground power supply VSSL), and the MOS transistor QP12 is in the ON state.

Accordingly, at this time, since the internal node VN12 is at high level (level of low-voltage power supply VDDL) and the MOS transistor QN13 is in the ON state, the internal node VN13 is at low level (level of ground power supply VSSM) and the MOS transistor QN12 is in the OFF state. In addition, since the MOS transistor QN15 is in the ON state and the output of the inverter IV11 is at low level (level of ground power supply VSSL), the MOS transistor QN14 is in the OFF state.

Thus, at this time, since the internal node VN15 is at low level (ground power supply VSSL) and the MOS transistor QP14 is in the ON state, the internal node VN14 is at high level (high-voltage power supply VDDH) and the MOS transistor QP15 is in the OFF state. Since the internal node VN12 is at high level (low-voltage power supply VDDL), the gate-source voltage VGS of the MOS transistor QN16 is lower than the threshold voltage of the transistor QN16 and is in the OFF state. Since the internal node VN14 is at high level (high-voltage power supply VDDH), the gate-source voltage VGS of the transistor QP16 falls below the threshold voltage of the transistor QP16 and is in the ON state.

As a result, at time point t1, the output OUT1 of the level conversion circuit is at high level (level of high-voltage power supply VDDH).

(Time Point t2)

Subsequently, at time point t2, when the input signal IN1 transitions from high level (low-voltage power supply VDDL) to low level (ground power supply VSSL), the transistor QP13 is turned on and the internal node VN11 rises to high level (low-voltage power supply VDDL). Thus, the transistor QP12 is turned off. Accordingly, the internal node VN13 transitions from low level (ground power supply VSSM) to high level (low-voltage power supply VDDL). If the voltage level of the internal node VN13 exceeds the threshold voltage of the transistor QN12, the transistor QN12 is turned on and the internal node VN12 begins to transition to low level (ground power supply VSSM). If the voltage level of the internal node VN12 falls below the threshold voltage of the transistor QN13, the transistor QN13 is turned off. In addition, the transistor QN15 is turned off, the internal node VN11 rises to high level (low-voltage power supply VDDL), and the transistor QN14 is turned on.

Accordingly, at time point t2, the internal node VN14 transitions from high level (high-voltage power supply VDDH) to low level (ground power supply VSSL). If the voltage level of the internal node VN14 falls below the threshold voltage of the transistor QP15, the transistor QP15 is turned on and the internal node VN15 transitions to high level (high-voltage power supply VDDH). If the voltage level of the internal node VN15 exceeds the threshold voltage of the transistor QP14, the transistor QP14 is turned off.

Since the internal node VN14 is at low level (ground power supply VSSL), the gate-source voltage VGS of the transistor QP16 exceeds the threshold voltage of the transistor QP16 and the transistor QP16 is turned off. Since the internal node VN12 is at low level (ground power supply VSSM), the gate-source voltage VGS of the transistor QN16 exceeds the threshold voltage of the transistor QN16 and the transistor QN16 is turned on.

As a result, at time point t2, the output OUT1 of the level conversion circuit is at low level (ground power supply VSSM).

<Breakdown Voltage of Transistor QP16, QN16 at Time Point t2>

A description is given of breakdown voltages of a gate-source voltage VGS and a source-drain voltage VDS of the transistor QP16, QN16 when the input signal IN1 is at low level (ground power supply VSSL) (at time point t2). In this embodiment, for the purpose of description, it is assumed that the potentials at the respective power supply terminals, the gate-source voltage VGS and the source-drain voltage VDS are set at the following values.

VDDH=4V, VDDL=1.5V, VSSL=0V, VSSM=−2.5V;

Breakdown voltages of the gate-source voltage VGS and the source-drain voltage VDS: 4V.

In the meantime, the breakdown voltage of the transistor QP16, QN16 is equal to that of other MOS transistors of the level conversion units 11 and 12, other than the output unit 13.

Since the gate voltage of the transistor QP16 is the ground power supply VSSL (0V), the source voltage thereof is the ground voltage VSSL (0V) and the drain voltage thereof is the ground voltage VSSM (−2.5V), the gate-source voltage VGS of the transistor QP16 is the ground power supply VSSL (0V)−the ground power supply VSSL (0V))=0V, and the source-drain voltage VDS of the transistor QP16 is ΔV1 (ground power supply VSSL (0V)−ground power supply VSSM (−2.5V)=2.5V). As described above, at time point t2, the gate-source voltage VGS and the source-drain voltage VDS of the transistor QP16 in this embodiment are ΔV1 at maximum. Thus, the breakdown voltages of the voltage VGS and voltage VDS fall within the range of the breakdown voltage (4V).

In addition, since the gate voltage of the transistor QN16 is the ground power supply VSSL (0V), the source voltage thereof is the ground voltage VSSM (−2.5V) and the drain voltage thereof is the ground voltage VSSM (−2.5V), the gate-source voltage VGS of the transistor QN16 is ΔV1 (VSSL (0V)−VSSM (−2.5V)=2.5V), and the source-drain voltage VDS of the transistor QN16 is VSSM (−2.5V)−VSSM (−2.5V)=0V.

As described above, at time point t2, the gate-source voltage VGS and the source-drain voltage VDS of the transistor QN16 in this embodiment are ΔV1 at maximum. Thus, the breakdown voltages of the voltage VGS and voltage VDS fall within the range of the breakdown voltage (4V).

(Time Point t3)

Again, the operation of the level conversion circuit of this embodiment is described. As shown in FIG. 2, when the input signal IN1 transitions from low level (ground power supply VSSL) to high level (low-voltage power supply VDDL) at time point t3, the transistor QP13 is turned off, the output of the inverter VN11 is at low level (ground power supply VSSL) and the transistor QP12 is turned on. Accordingly, the internal node VN12 transitions from low level (ground power supply VSSL) to high level (low-voltage power supply VDDL). If the voltage level of the internal node VN12 exceeds the threshold voltage of the transistor QN13, the transistor QN13 is turned on. Thus, the internal node VN13 transitions to low level (ground power supply VSSL). If the voltage level of the internal node VN13 falls below the threshold voltage of the transistor QN12, the transistor QN12 is turned off. In addition, the transistor QN15 is turned on, the inverter VN11 is at low level (ground power supply VSSL) and the transistor QN14 is turned off.

Accordingly, at time point t3, the internal node VN15 transitions from high level (high-voltage power supply VDDH) to low level (low-voltage power supply VSSL). If the voltage level of the internal node VN15 falls below the threshold voltage of the transistor QP14, the transistor QP14 is turned on. Further, when the internal node VN14 transitions to high level (high-voltage power supply VDDH) and the voltage level thereof exceeds the threshold voltage of the transistor QP15, the transistor QP15 is turned off. Since the internal node VN12 is at high level (low-voltage power supply VDDL), the source-gate voltage VGS of the transistor QN16 falls below the threshold voltage of the transistor QN16 and the transistor QN16 is turned off. Since the internal node VN14 is at high level (high-voltage power supply VDDH), the source-gate voltage VGS of the transistor QP16 falls below the threshold voltage of the transistor QP16 and the transistor QP16 is turned on.

As a result, at time point t3, the output OUT1 of the level conversion circuit is at high level (high-voltage power supply VDDH).

<Breakdown Voltage of Transistor QP16, QN16 at Time Point t3>

A description is given of breakdown voltages of a source-gate voltage VGS and a source-drain voltage VDS of the transistor QP16, QN16 when the input signal IN1 is at high level (low-power supply VDDL) (at time point t3). In this description, the potentials at the respective power supply terminals, the gate-source voltage VGS and the source-drain voltage VDS are set at the same values as described above.

Since the gate voltage of the transistor QP16 is the ground power supply VSSL (0V), the source voltage thereof is the high-voltage power supply VDDH (4V) and the drain voltage thereof is the high-voltage power supply VDDH (4V), the source-gate voltage VGS of the transistor QP16 is ΔV2 (high-voltage power supply VDDH (4V)−ground power supply VSSL (0V)=4V). The source-drain voltage VDS of the transistor QP16 is the high-voltage power supply VDDH (4V)−the high-voltage power supply VDDH (4V)=0.

As described above, at time point t3, the gate-source voltage VGS and the source-drain voltage VDS of the transistor QP16 in this embodiment are ΔV2 at maximum. Thus, the breakdown voltages of the voltage VGS and voltage VDS fall within the range of the breakdown voltage (4V).

In addition, since the gate voltage of the transistor QN16 is the ground power supply VSSL (0V), the source voltage thereof is the low-voltage power supply VDDL (1.5V) and the drain voltage thereof is the high-voltage power supply VDDH (4V), the gate-source voltage VGS of the transistor QN16 is the low-voltage power supply VDDL (1.5V)−the ground power supply VSSL (0V)=1.5V, and the source-drain voltage VDS of the transistor QN16 is the high-voltage power supply VDDH (4V)−the ground power supply VDDL (1.5V)=2.5V.

Thus, at time point t3, the gate-source voltage VGS and the source-drain voltage VDS of the transistor QN16 in this embodiment are ΔV2 at maximum. Thus, the breakdown voltages of the voltage VGS and voltage VDS fall within the range of the breakdown voltage (4V).

As described above, in the level conversion circuit according to this embodiment, even in the case where the amplitude of the output voltage is between the high-voltage power supply VDDH and ground power supply VSSM, the source-gate voltage VGS and source-drain voltage VDS of the transistor QP16, QN16, which constitutes the output unit 13, can be set, at maximum, at ΔV1 (VSSL (0V)−VSSM (−2.5V)=2.5V) or ΔV2 (high-voltage power supply VDDH (4V)−ground power supply VSSL (0V)=4V).

Thus, the level conversion circuit of this embodiment can be operated without an overvoltage of maximum amplitude voltage (VDDH (4V)−VSSM (−2.5V)=6.5V) being applied to the transistor QP16, QN16, which constitutes the output unit 13.

In the present embodiment, the source-gate voltage VGS and source-drain voltage VDS of the transistor QP16, QN16 is set at 4V. However, if the following condition is satisfied, the output amplitude can be set at VDDH−VSSM:
breakdown voltage≧VDDH−VSSM, breakdown voltage≧VDDL−VSSM.

If the breakdown voltage can be increased, as described above, the voltage value of the high-voltage power supply VDDH can be increased by that much and the voltage value of the ground power supply VSSM can be decreased.

<Advantageous Effects of the Level Conversion Circuit According to the Present Embodiment>

According to the level conversion circuit of this embodiment, at least the following advantageous effects (1) and (2) can be obtained.

(1) The output potential difference can be increased, and an overvoltage can be prevented from being applied to the transistors constituting the output.

(1)-1. The output potential difference can be increased.

The level conversion circuit according to this embodiment includes the negative-side level conversion unit 11 in addition to the positive-side level conversion unit 12.

Thus, not only a level of the high-voltage power supply VDDH (at time point t3) but also a level of the ground power supply VSSM (at time point t2) can be produced as the output voltage OUT1 of the level conversion circuit. Since the output voltage OUT1 can be converted to both positive and negative polarities, the output potential difference can be increased.

For example, in the present embodiment, since VDDH=4V and VSSM=−2.5V, the output potential difference of the output voltage OUT1 of the level conversion circuit can be set at the high-voltage power supply VDDH (4V)−the ground power supply VSSM (−2.5V)=6.5V or thereabout.

(1)-2. An overvoltage can be prevented from being applied to the transistors constituting the output.

(At time point t2) When the input signal IN1 is at low level (ground power supply VSSL), the P-type MOS transistor QP16 that constitutes the output unit 13 is in the OFF state since the internal node VN14 is at low level (ground power supply VSSL) and thus the gate-source voltage VGS of the P-type MOS transistor QP16 exceeds the threshold voltage of the P-type MOS transistor QP16.

On the other hand, at this time, the N-type MOS transistor QN16 that constitutes the output unit 13 is in the ON state since the internal node VN12 is at low level (ground power supply VSSM) and thus the gate-source voltage VGS of the N-type MOS transistor QN16 exceeds the threshold voltage of the N-type MOS transistor QN16.

(At time point t3) When the input signal IN1 is at high level (low-voltage power supply VDDL), the P-type MOS transistor QP16 that constitutes the output unit 13 is in the ON state since the internal node VN14 is at high level (high-voltage supply VDDH) and thus the gate-source voltage VGS of the P-type MOS transistor QP16 falls below the threshold voltage of the P-type MOS transistor QP16.

On the other hand, at this time, the N-type MOS transistor QN16 is turned off since the internal node VN12 is at high level (low-voltage supply VDDL) and thus the gate-source voltage VGS of the N-type MOS transistor QN16 falls below the threshold voltage of the N-type MOS transistor QN16.

As described above, the output unit 13 includes transistors QP16 and QN16 of different conductivity types, and one of the transistors QP16 and QN16 is turned on and the other is turned off in accordance with the positive/negative input logic of the input signal IN1. Thus, as described in the above (1)-1, even in the case where the output potential difference is increased, constant application of the maximum output voltage to the transistor QP16, QN16 of the output unit 13 can be prevented, and overvoltage higher than the breakdown voltage can be prevented from being applied to the transistor QP16, QN16.

For example, in the case of the present embodiment, at time point t2, the breakdown voltages of the gate-source voltage VGS and the source-drain voltage VDS of the MOS transistor QP16, QN16 can be set within the range of the breakdown voltage (4V). Similarly, even at time point t3, the breakdown voltages of the gate-source voltage VGS and the source-drain voltage VDS of the MOS transistor QP16, QN16 can be set within the range of the breakdown voltage (4V).

(2) The manufacturing cost can advantageously be reduced.

As described in the above (1)-2, according to the level conversion circuit of this embodiment, an overvoltage can be prevented from being applied to the transistors QP16 and QN16, which constitute the output unit 13.

Thus, there is no need to increase the breakdown voltage of only the transistors QP16 and QN16 that constitute the output unit 13. Accordingly, no additional fabrication process is required for increasing the breakdown voltage of only the transistor QP16, QN16. The transistors QP16 and QN16, which constitute the output unit 13, can be fabricated by the same process for fabricating the other transistors which constitute the input unit 10 and the negative-side and positive-side level conversion units 11 and 12.

As a result, the increase in number of fabrication steps can be prevented, and the manufacturing cost can advantageously be reduced.

Second Embodiment

Another Example of the Output Unit

Figure 3:
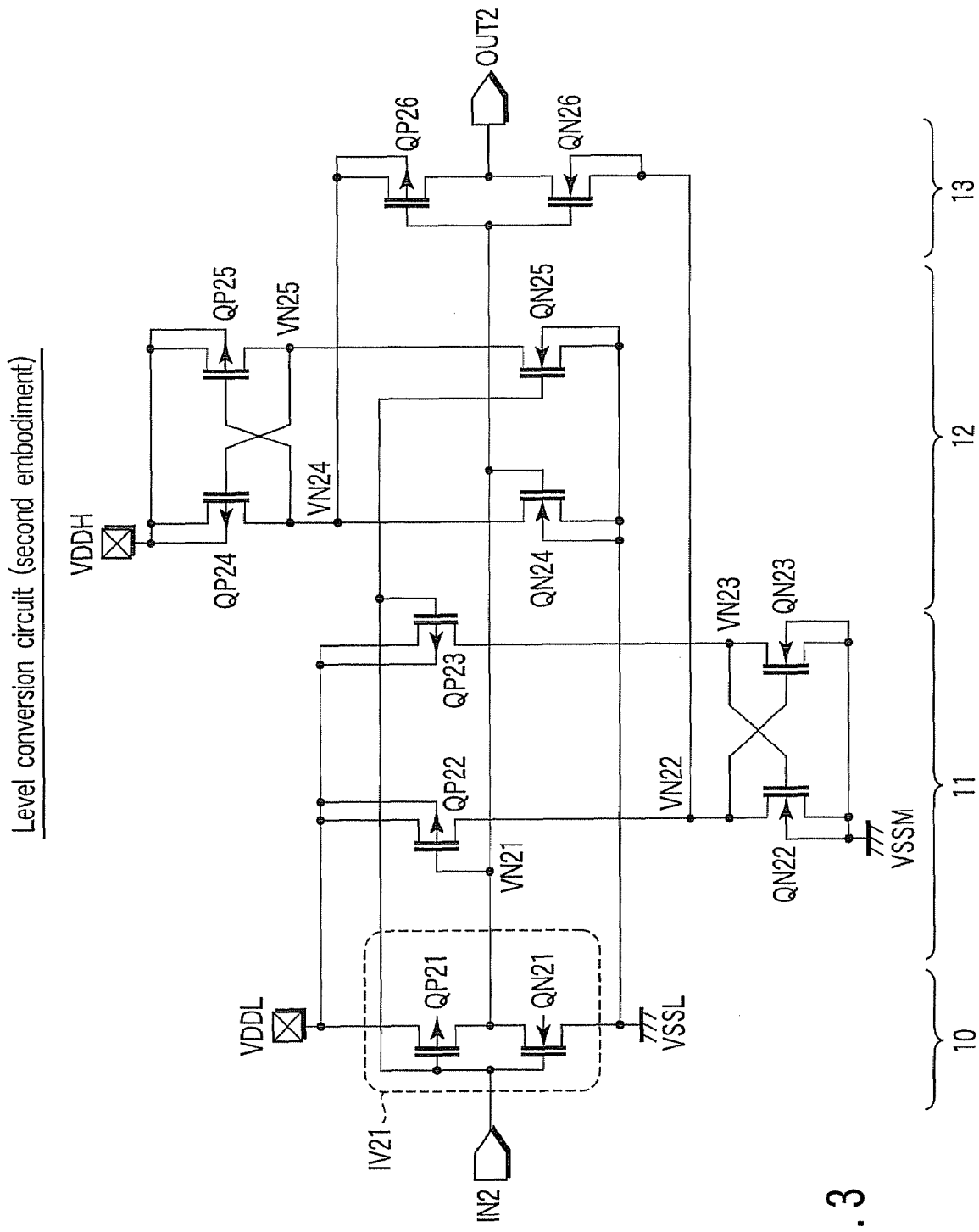
FIG. 3 is a circuit diagram showing a level conversion circuit according to a second embodiment of the present invention.
Figure 4:
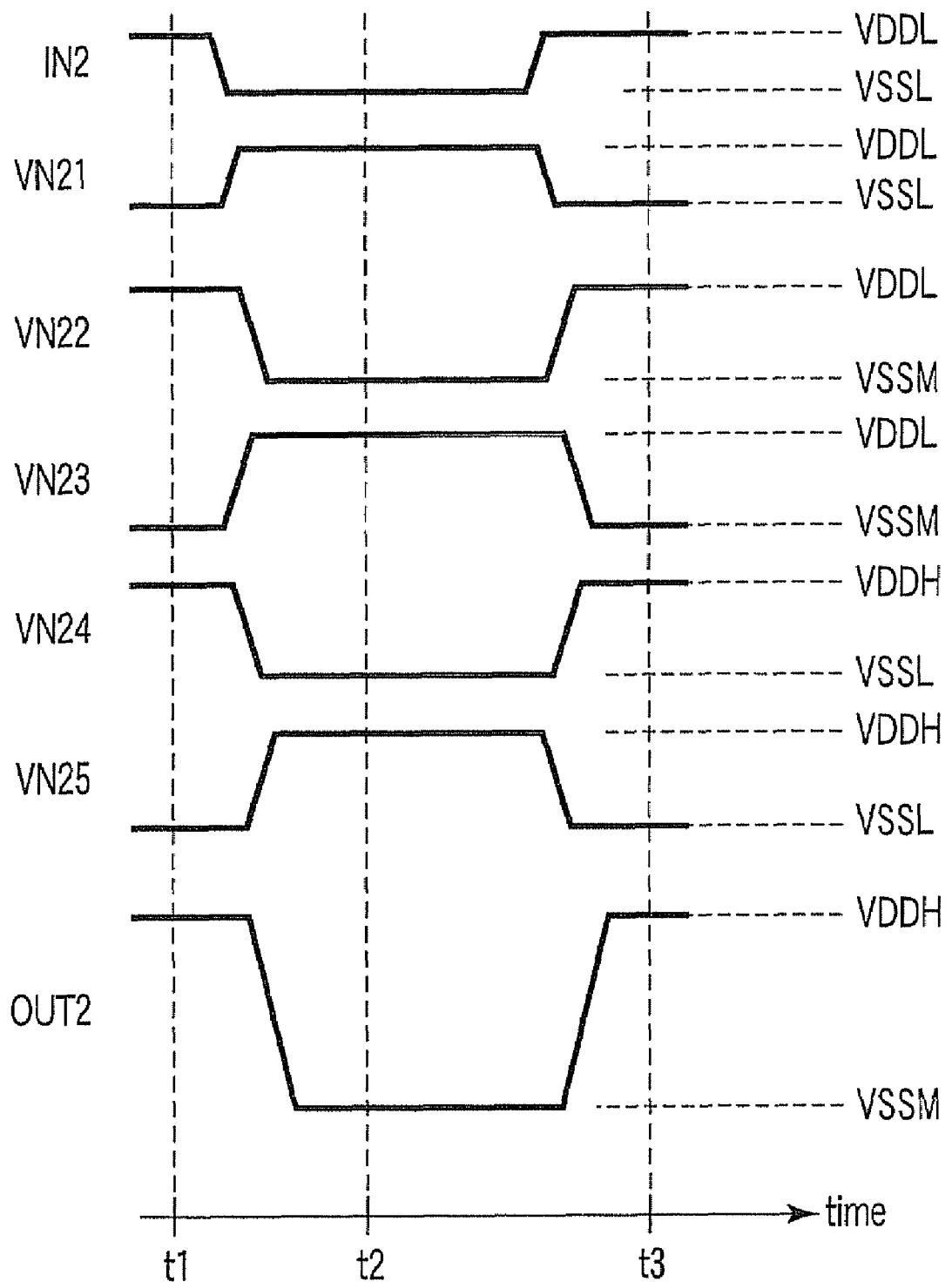
FIG. 4 is an operational waveform diagram illustrating the operation of the level conversion circuit according to the second embodiment.

Next, a level conversion circuit according to a second embodiment of the invention is described with reference to FIG. 3 and FIG. 4. The second embodiment relates to another example of the output unit 13. A detailed description of the parts common to those in the first embodiment is omitted here.

<Example of Structure>

To begin with, an example of the structure of the level conversion circuit according to this embodiment is described with reference to FIG. 3. As shown in FIG. 3, the second embodiment differs from the first embodiment in that the gates of a P-type MOS transistor QP26 and an N-type MOS transistor QN26, which constitute the output unit 13, are commonly connected to an output (internal node VN21) of the inverter VN21.

<Operation>

Next, the operation of the level conversion circuit according to this embodiment is described with reference to FIG. 4. FIG. 4 shows operational waveforms of the level conversion circuit of this embodiment. As shown in FIG. 4, the operation of this level conversion circuit is substantially the same as that of the level conversion circuit of the first embodiment.

However, in the level conversion circuit of the first embodiment, the gates of the transistors QP16 and QN16 that constitute the output unit 13 are connected to the ground power supply VSSL. Thus, the value of the negative logic output voltage (VSSM), which can be output, must be lower than the value shown below.

VSSM<VSSL−Vthn (threshold voltage of transistor QN16).

On the other hand, in the level conversion circuit of the second embodiment, the gates of the transistors QP26 and QN26, which constitute the output unit 13, are connected to the output (internal node VN21) of the inverter VN21. Thus, the amplitude of the voltage, which is applied to the gates of the transistors QP26 and QN26, varies between the low-voltage power supply VDDL and the ground power supply VSSL on the basis of the input signal IN2.

Thus, in the level conversion circuit of this embodiment, when the output voltage OUT2 produces a level of the ground power supply VSSM (at time point t2), the internal node VN21 is at the voltage level of the ground power supply VDDL. Accordingly, the output that meets the following condition can be produced:

VSSM<VSSL−Vthn (voltage value: VSSL<VDDL).

Therefore, in this embodiment, the range of the negative logic output voltage (VSSM), which can be output, can be increased.

<Advantageous Effects of the Level Conversion Circuit of the Second Embodiment>

According to the above-described level conversion circuit of this embodiment, the same advantageous effects (1) and (2) as described above can be obtained. Furthermore, at least the following advantageous effect (3) can be obtained.

(3) The range of the negative logic output voltage (VSSM), which can be output, can be increased.

In the level conversion circuit according to this embodiment, the gates of the P-type MOS transistor QP26 and N-type MOS transistor QN26, which constitute the output unit 13, are commonly connected to the output (internal node VN21) of the inverter VN21. Thus, the amplitude of the voltage, which is applied to the gates of the transistors QP26 and QN26, varies between the low-voltage power supply VDDL and the ground power supply VSSL on the basis of the input signal IN2.

In the level conversion circuit of this embodiment, when the output voltage OUT2 produces a level of the ground power supply VSSM (at time point t2), the internal node VN21 is at the voltage level of the ground power supply VDDL, and accordingly, the output that meets the following condition can be produced:

VSSM<VSSL−Vthn (voltage value: VSSL<VDDL).

Therefore, according to this embodiment, the range of the negative logic output voltage (VSSM), which can be output, can advantageously be increased.

Third Embodiment

An Example Including Load-Reducing Units

Next, a level conversion circuit according to a third embodiment of the invention is described with reference to FIG. 5 and FIG. 6. The third embodiment relates to an example in which load-reducing units IV33 and IV34 are further included. A detailed description of the parts common to those in the first embodiment is omitted here.

<Example of Structure>

An example of the structure of the level conversion circuit according to this embodiment is described with reference to FIG. 5.

As shown in FIG. 5, the level conversion circuit of the third embodiment differs from that of the first embodiment in the following respects.

The level conversion circuit of the third embodiment includes an inverter IV33 (first load-reducing unit) which outputs a voltage level of the high-voltage power supply VDDH and a voltage level of the ground power supply VSSL on the basis of the output of the positive-side level conversion unit 12, and an inverter IV34 (second load-reducing unit) which outputs a voltage level of the low-voltage power supply VDDL and a voltage level of the ground power supply VSSM on the basis of the output of the negative-side level conversion unit 11.

Further, the level conversion circuit of the third embodiment includes an inverter IV32 which is composed of a P-type MOS transistor QP32 and an N-type MOS transistor QN32 and is operated by the low-voltage power supply VDDL.

The inverter IV32 is configured such that the source-drain paths of the transistors QP32 and QN32 are connected in series between the low-voltage power supply VDDL and the ground power supply VSSL, and the gates of the transistors QP32 and QN32 are connected to an output of the inverter IV31.

The inverter IV33 (first load-reducing unit) is composed of a P-type MOS transistor QP37 and an N-type MOS transistor QN37. The inverter IV33 is configured such that the source-drain paths of the transistors QP37 and QN37 are connected in series between the high-voltage power supply VDDH and ground power supply VSSL, and the gates of the transistors QP37 and QN37 are commonly connected to an internal node VN35.

The inverter IV34 (second load-reducing unit) is composed of a P-type MOS transistor QP38 and an N-type MOS transistor QN38. The inverter IV34 is configured such that the source-drain paths of the transistors QP38 and QN38 are connected in series between the low-voltage power supply VDDL and ground power supply VSSM, and the gates of the transistors QP38 and QN38 are commonly connected to an internal node VN33.

As regards other connections in the circuit, as shown in FIG. 5, the source-drain paths of transistors QP33 and QN33 are connected in series between the low-voltage power supply VDDL and the ground power supply VSSM having a lower level than the ground power supply VSSL. Similarly, the source-drain paths of transistors QP34 and QN34 are connected in series between the low-voltage power supply VDDL and the ground power supply VSSM. The gate of the transistor QN33 is connected to an internal node VN34 that is a connection node between the transistors QP34 and QN34, and the gate of the transistor QN34 is connected to an internal node VN33 that is a connection node between the transistors QP33 and QN33. The gate of the transistor QP34 is connected to an internal node VN31, and the gate of the transistor QP33 is connected to an output of the inverter IV32.

The source-drain paths of the transistors QP35 and QN35 are connected in series between the high-voltage power supply VDDH and the ground power supply VSSL. Similarly, the source-drain paths of the transistors QP36 and QN36 are connected in series between the high-voltage power supply VDDH and the ground power supply VSSL.

The gate of the transistor QP35 is connected to an internal node VN36 that is a connection node between the transistors QP36 and QN36, and the gate of the transistor QP36 is connected to an internal node VN35 that is a connection node between the transistors QP35 and QN35. The gate of the transistor QN36 is connected to an output node VN31 of the inverter IV31, and the gate of the transistor QN35 is connected to an output node VN32 of the inverter IV32.

The source-drain paths of transistors QP39 and QN39 are connected in series between an output node VN37 of the inverter IV33 and an output node VN38 of the inverter IV34. The gates of the transistors QP39 and QN39 are commonly connected to the output node VN31, and the drains of the transistors QP39 and QN39 are commonly connected to an output terminal OUT3.

In this embodiment, in principle, the voltage values have the following relationship:

level of VSSM<level of VSSL, level of VDDL<level of VDDH.

The circuit of this embodiment is also operable even with the following relationship of voltage values:

level of VDDH<level of VDDL, level of VSSM>level of VSSL.

Specifically, since the inverter IV32 is provided in this embodiment, even when the voltage level of the ground power supply VSSM becomes higher than the voltage level of the ground power supply VSSL for some reason (level of VSSM>level of VSSL), the circuit of this embodiment is operable.

<Operation>

Next, the operation of the level conversion circuit according to this embodiment is described with reference to FIG. 6. FIG. 6 shows operational waveforms in the level conversion circuit of this embodiment.

(Time Point t1)

Figure 6:
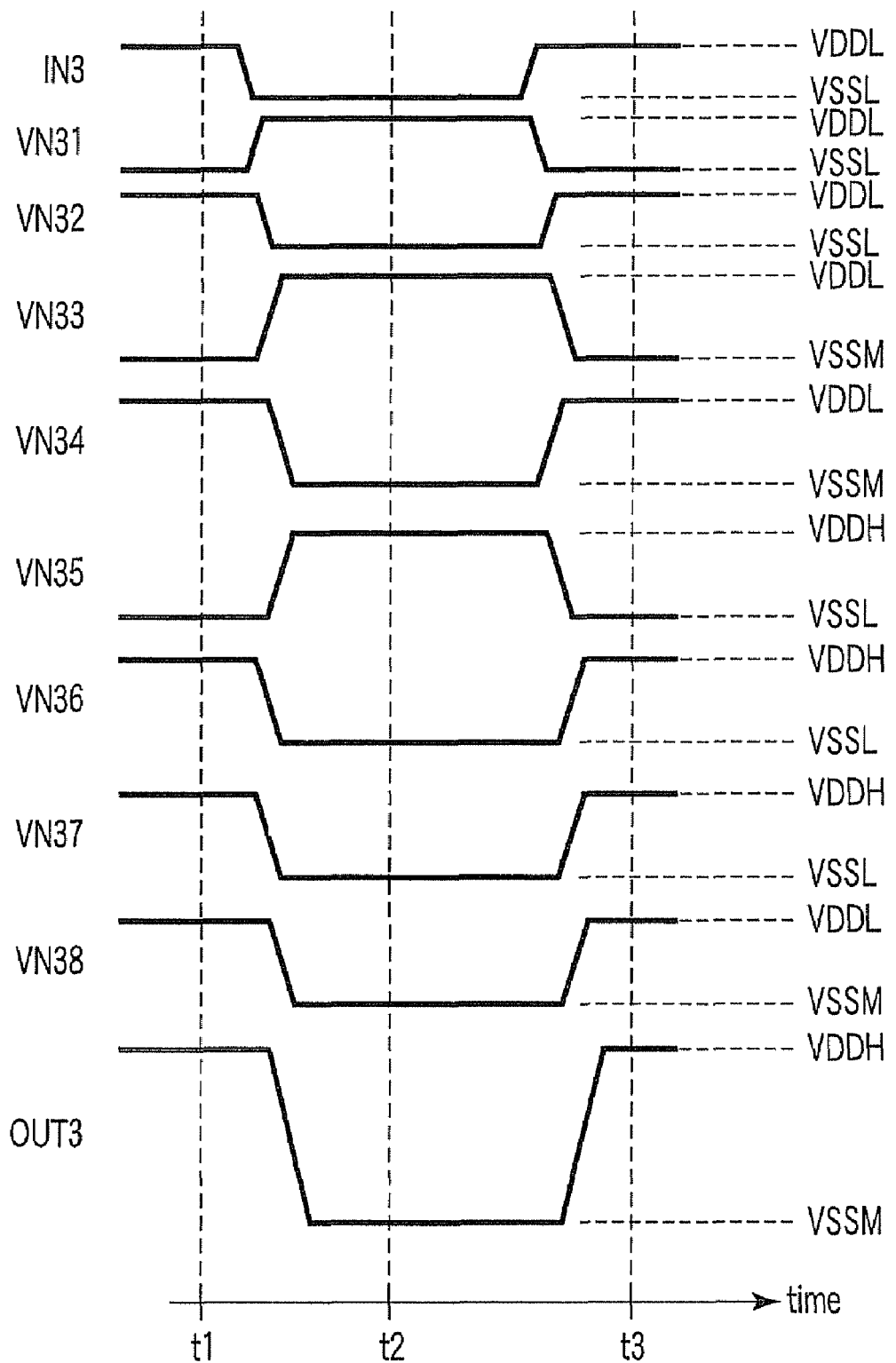
FIG. 6 is an operational waveform diagram illustrating the operation of the level conversion circuit according to the third embodiment.

As shown in FIG. 6, when an input signal IN3 is at high level (low-voltage power supply VDDL) (at time point t1), the output node VN31 of the inverter IV31 is at low level (ground power supply VSSL), the output node VN32 of the inverter IV32 is at high level (low-voltage power supply VDDL), the transistor QP33 is in the OFF state, and the transistor QP34 is in the ON state.

Thus, since the internal node VN34 is at high level (low-voltage power supply VDDL) and the transistor QN33 is in the OFF state, the internal node VN33 is at low level (ground power supply VSSM) and the transistor QN34 is in the OFF state.

In addition, the transistor QN35 is in the ON state and the transistor QN36 is in the OFF state. Thus, since the internal node VN35 is at low level (low-voltage power supply VSSL) and the transistor QN36 is in the ON state, the internal node VN36 is at high level (high-voltage power supply VDDH) and the transistor QP35 is in the OFF state.

Since the output node VN38 of the inverter IV34 is at high level (low-voltage power supply VDDL) and the output node VN31 is at low level (low-voltage power supply VSSL), the transistor QN39 is in the OFF state. On the other hand, since the output node VN37 of the inverter IV33 is at high level (high-voltage power supply VDDH), the transistor QP39 is in the OFF state.

As a result, at time point t1, the output OUT3 of the level conversion circuit is at high level (high-voltage power supply VDDH).

(Time Point t2)

Next, a description is given of the operation at the time when the input signal IN3 transitions from high level (VDDL) to low level (VSSL).

At this time, the output node VN31 of the inverter IV31 is at high level (VDDL), the output node VN32 of the inverter IV32 is at low level (VSSL), the transistor QP33 is turned on, and the transistor QP34 is turned off.

Accordingly, the internal node VN33 transitions from low level (VSSM) to high level (VDDL). If the voltage level of the internal node VN33 exceeds the threshold voltage of the transistor QN34, the transistor QN34 is turned on and the internal node VN34 transitions to low level (VSSM). If the voltage level of the internal node VN34 falls below the threshold voltage of the transistor QN33, the transistor QN33 is turned off.

In addition, at this time, the transistor QN35 is turned off and the transistor QN36 is turned on.

Accordingly, the internal node VN36 transitions from high level (VDDH) to low level (VSSL). If the voltage level of the internal node VN36 falls below the threshold voltage of the transistor QP35, the transistor QP35 is turned on and the internal node VN35 transitions to high level (VDDH). If the voltage level of the internal node VN35 exceeds the threshold voltage of the transistor QP36, the transistor QP36 is turned off.

The output node VN37 of the inverter IV33 transitions from high level (VDDH) to low level (VSSL). Since the internal node VN31 is at high level (VDDL), the source-gate voltage VGS of the transistor QP39 exceeds the threshold voltage of the transistor QP39, and the transistor QP39 is turned off.

On the other hand, the output node VN38 of the inverter IV34 transitions from high level (VDDL) to low level (VSSM), the source-gate voltage VGS of the transistor QN39 exceeds the threshold voltage of the transistor QN39, and the transistor QN39 is turned on.

As a result, at time point t2, the output OUT3 of the level conversion circuit is at low level (VSSM).

(Time Point t3)

Next, a description is given of the operation at the time when the input signal IN3 transitions from low level (VSSL) to high level (VDDL) (at time point t3).

At this time, the output node VN31 of the inverter IV31 is at low level (VSSL), the output node VN32 of the inverter IV32 is at high level (VDDL), the transistor QP33 is turned off, and the transistor QP34 is turned on.

Accordingly, the internal node VN34 transitions from low level (VSSM) to high level (VDDL). If the voltage level of the internal node VN34 exceeds the threshold voltage of the transistor QN33, the transistor QN33 is turned on and the internal node VN33 transitions to low level (VSSM). If the voltage level of the internal node VN33 falls below the threshold voltage of the transistor QN34, the transistor QN34 is turned off. In addition, the transistor QN35 is turned on and the transistor QN36 is turned off.

Accordingly, the internal node VN35 transitions from high level (VDDH) to low level (VSSL). If the voltage level of the internal node VN35 falls below the threshold voltage of the transistor QP36, the transistor QP36 is turned on and the internal node VN36 transitions to high level (VDDH). If the voltage level of the internal node VN36 exceeds the threshold voltage of the transistor QP35, the transistor QP35 is turned off.

The output node VN38 of the inverter IV34 transitions from low level (VSSM) to high level (VDDL). Since the output node VN31 is at low level (VSSL), the source-gate voltage VGS of the transistor QN39 falls below the threshold voltage of the transistor QN39, and the transistor QN39 is turned off.

On the other hand, the output node VN37 of the inverter IV33 transitions from low level (VSSL) to high level (VDDH), the source-gate voltage VGS of the transistor QP39 exceeds the threshold voltage of the transistor QP39, and the transistor QP39 is turned on.

As a result, at time point t3, the output OUT3 of the level conversion circuit is at high level (VDDH).

Like the above-described first embodiment, at time points t2 and t3, the maximum output voltage VDDH-VSSM is not applied as the source-gate voltage VGS and source-drain voltage VDS of the transistor QP39, QN39 of the output unit 13. Therefore, the level conversion circuit can operate without application of overvoltage.

<Advantageous Effect of the Level Conversion Circuit According to the Third Embodiment>

According to the above-described level conversion circuit of this embodiment, the same advantageous effects (1) and (2) as described above can be obtained. Furthermore, at least the following advantageous effect (4) can be obtained.

(4) The high-speed operation can advantageously be performed.

The level conversion circuit of the third embodiment includes the inverter IV33 (first load-reducing unit) which outputs a voltage level of the high-voltage power supply VDDH and a voltage level of the ground power supply VSSL on the basis of the output of the positive-side level conversion unit 12, and the inverter IV34 (second load-reducing unit) which outputs a voltage level of the low-voltage power supply VDDL and a voltage level of the ground power supply VSSM on the basis of the output of the negative-side level conversion unit 11.

Since the outputs of the negative-side and positive-side level conversion units 11 and 12 are connected to the inputs of the inverters IV33 and IV34 (first and second load-reducing units), the loads of the outputs of the negative-side and positive-side level conversion units 11 and 12 can be reduced, and the speed of transition of the output voltage can be increased. Therefore, the high-speed operation can advantageously be performed.

For example, in the case of the structure of this embodiment, when the output voltage OUT3 transitions to high level (VDDH), the output terminal potential is raised to high level (VDDH) by the P-type MOS transistors QP37 and QP38 of the inverters IV33 and IV34 (first and second load-reducing units) and the P-type MOS transistor QP39 of the output unit 13. On the other hand, when the output voltage OUT3 transitions to low level, the output terminal potential is lowered to low level (VSSM) by the N-type MOS transistors QN37 and QN38 of the inverters IV33 and IV34 (first and second load-reducing units) and the N-type MOS transistor QN39 of the output unit 13. Therefore, the speed of transition of the output voltage can be increased.

Comparative Example

An Example in Which Neither a Negative-Side Level Conversion Unit nor an Output Unit is Provided Next, for the purpose of comparison with the level conversion circuits of the first to third embodiments, a level conversion circuit according to a comparative example is described with reference to FIG. 7 and FIG. 8. This comparative example relates to an example in which neither a negative-side level conversion unit nor an output unit is provided. A detailed description of the parts common to those in the first embodiment is omitted here.

<Example of Structure>

Figure 7:
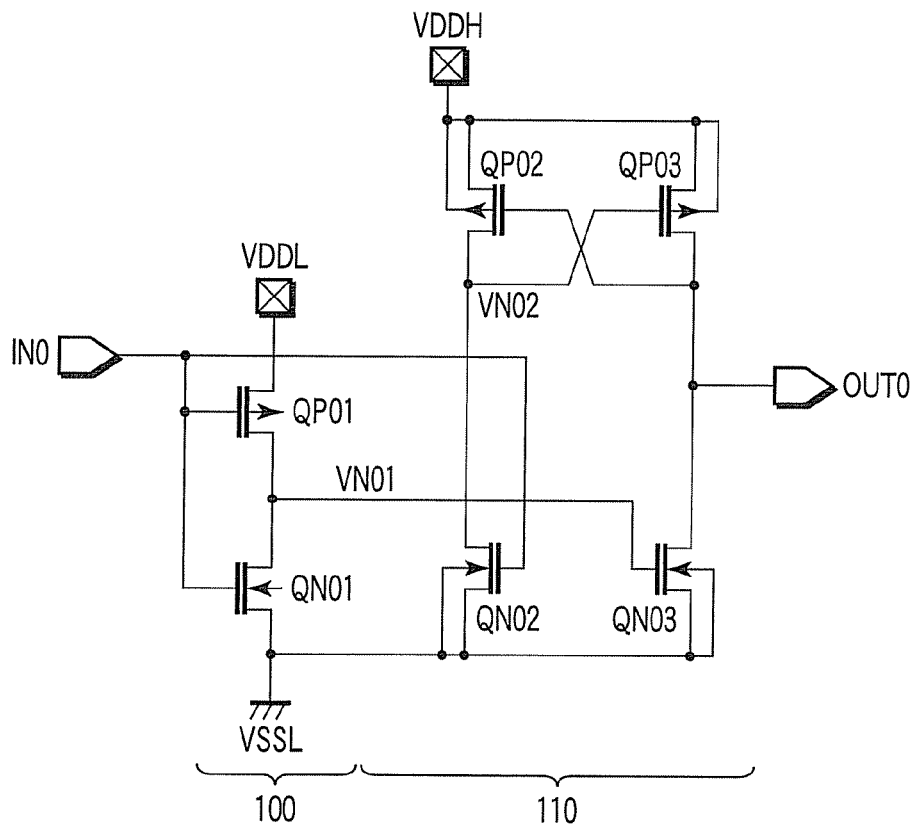
FIG. 7 is a circuit diagram showing a level conversion circuit according to a comparative example.

As shown in FIG. 7, the comparative example differs from the first embodiment in that the level conversion circuit of the comparative example does not include the negative-side level conversion unit 11 or the output unit 13.

Specifically, the level conversion circuit of the comparative example includes only an input unit 100 and a level conversion unit 110.

The input unit 100 is composed of a P-type MOS transistor QP01 and an N-type MOS transistor QN01. The source-drain paths of the transistors QP01 and QN01 are connected in series between the low-voltage power supply VDDL and the ground power supply VSSL, and thus an inverter is constituted. An input signal IN0 is input to the gates of the transistors QP01 and QN01.

The level conversion unit 110 is composed of two P-type MOS transistors QP02 and QP03 and two N-type MOS transistors QN02 and QN03.

The source-drain paths of the transistors QP02 and QN02 are connected in series between the high-voltage power supply VDDH and the ground power supply VSSL. Similarly, the source-drain paths of the transistors QP03 and QN03 are connected in series between the high-voltage power supply VDDH and the ground power supply VSSL. The gate of the transistor QP02 is connected to an output terminal OUT0 which is a connection node between the transistors QP03 and QN03, and the gate of the transistor QP03 is connected to an internal node VN02 which is a connection node between the transistors QP02 and QN02.

An input signal IN0 is input to the gate of the transistor QN02. The gate of the transistor QN03 is connected to an output node VN01 of an inverter 01 that is operated by the low-voltage power supply VDDL.

In the case of this comparative example, the high level of the input signal IN0 is the level of the low-voltage power supply VDDL, and the low level of the input signal IN0 is the level of the ground power supply VSSL.

<Operation>

Next, the operation of the level conversion circuit according to the comparative example is described with reference to FIG. 8. FIG. 8 shows operational waveforms in the level conversion circuit of the comparative example.

(Time Point t1)

Figure 8:
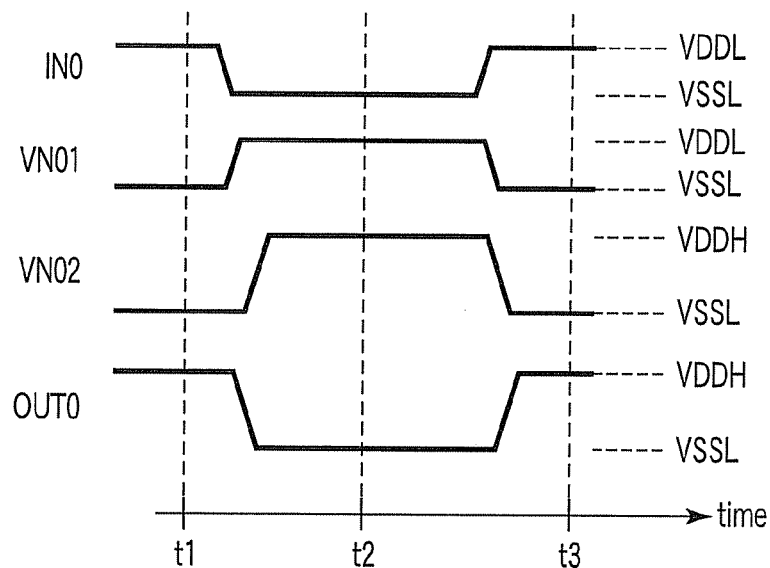
FIG. 8 is an operational waveform diagram illustrating the operation of the level conversion circuit according to the comparative example.

As shown in FIG. 8, when the input signal IN0 is at high level (level of VDDL) (at time point t1), the transistor QN02 is in the ON state, the output node VN01 of the inverter is at low level (level of VSSL), and the transistor QN03 is in the OFF state.

Accordingly, since the internal node VN02 is at low level and the transistor QP03 is in the ON state, the output terminal OUT0 is at high level (level of VDDH) and the transistor QP02 is in the OFF state.

(Time Point t2)

Subsequently, at time point t2, when the input signal IN0 transitions from high level (VDDL) to low level (VSSL), the transistor QN02 is turned off, the output node VN01 of the inverter is at high level and the transistor QN03 is turned on.

Accordingly, the output terminal OUT0 transitions from high level (VDDH) to low level (VSSL). If the voltage level of the output terminal OUT0 falls below the threshold voltage of the transistor QP02, the transistor QP02 is turned on. On the other hand, if the internal node VN02 transitions to high level (VDDH) and the voltage level of the internal node VN02 exceeds the threshold voltage of the transistor QP03, the transistor QP03 is turned off.

As a result, at time point t2, the output OUT0 of the level conversion circuit is at low level (VSSL).

(Time Point t3)

Subsequently, at time point t3, when the input signal IN0 transitions from to low level (VSSL) to high level (VDDL), the transistor QN02 is turned on, the output node VN01 of the inverter is at low level and the transistor QN03 is turned off.

Accordingly, the internal node VN02 transitions from high level (VDDH) to low level (VSSL). If the voltage level of the internal node VN02 falls below the threshold voltage of the transistor QP03, the transistor QP03 is turned on and the output terminal OUT0 begins to transition to high level (VDDH). If the voltage level of the output terminal OUT0 exceeds the threshold voltage of the transistor QP02, the transistor QP02 is turned off.

As a result, at time point t3, the output OUT0 of the level conversion circuit is at high level (VDDH).

As described above, the level conversion circuit of the comparative example includes only the positive-side level conversion unit 110, and does not include the negative-side level conversion unit. Thus, only the positive-side level conversion can be performed, and the negative-side level conversion is at ground potential (level of VSSL). Consequently, the output voltage difference of the level conversion circuit is low.

In addition, in the level conversion circuit of the comparative example, the positive/negative output potential difference (VDDH−VSSL) is constantly applied across the gate and source and across the drain and source of the output transistors QP03 and QN03 which constitute the output. Hence, it is not possible to obtain an output amplitude that is greater than the gate-source breakdown voltage and the drain-source breakdown voltage of the transistors, which are determined by the fabrication process.

In order to perform large-amplitude output voltage conversion, high-breakdown-voltage transistors, which can withstand a large-amplitude output voltage applied across the gate and source and across the drain and source, need to be provided in the section that constitutes the output. In this case, however, an additional fabrication process is needed to increase the breakdown voltages of only the transistors QP03 and QN03 that constitute the output, leading to an increase in number of fabrication steps and an increase in manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A level conversion circuit comprising:
a high-potential-side level conversion unit which is connected between a first high-voltage power supply and a first low-voltage power supply, and converts a high-potential-side voltage of an input signal;
a low-potential-side level conversion unit which is connected between a second high-voltage power supply with a lower voltage than the first high-voltage power supply and a second low-voltage power supply with a lower voltage than the first low-voltage power supply, and converts a low-potential-side voltage of the input signal;

a first load-reducing unit which outputs a voltage level of the first high-voltage power supply or a voltage level of the first low-voltage power supply on the basis of an output of the high-potential-side level conversion unit;

a second load-reducing unit which outputs a voltage level of the second high-voltage power supply or a voltage level of the second low-voltage power supply on the basis of an output of the low-potential-side level conversion unit; and an output unit to which an output of the first load-reducing unit and an output of the second load-reducing unit are input, and which outputs the voltage level of the first high-voltage power supply and the voltage level of the second low-voltage power supply, the output unit comprises a first transistor of a first conductivity type and a second transistor of a second conductivity type, current paths of the first transistor and the second transistor being connected in series between the first load-reducing unit and the second load-reducing unit.

2. The circuit according to claim 1, wherein the output unit includes a first MIS transistor of a first conductivity type and a second MIS transistor of a second conductivity type, current paths of the first MIS transistor and the second MIS transistor are connected in series, control terminals of the first MIS transistor and the second MIS transistor are commonly connected to an input of the output unit, a common node of the current paths of the first MIS transistor and the second MIS transistor is connected to an output of the output unit, a substrate electrode of the first MIS transistor is connected to the other end of the current path of the first MIS transistor, and a substrate electrode of the second MIS transistor is connected to the other end of the current path of the second MIS transistor.

3. The circuit according to claim 1, wherein the high-potential-side level conversion unit comprises:

a first transistor of a first conductivity type and a second transistor of a second conductivity type, current paths of the first transistor and the second transistor being connected in series between the first high-voltage power supply and the first low-voltage power supply; and a third transistor of the first conductivity type and a fourth transistor of the second conductivity type, current paths of the third transistor and the fourth transistor being connected in series between the first high-voltage power supply and the first low-voltage power supply, a control terminal of the first transistor being connected to the current paths of the third and fourth transistors, and a control terminal of the third transistor being connected to the current paths of the first and second transistors.

4. The circuit according to claim 1, wherein the low-potential-side level conversion unit comprises:

a first transistor of a first conductivity type and a second transistor of a second conductivity type, current paths of the first transistor and the second transistor being connected in series between the second high-voltage power supply and the second low-voltage power supply; and a third transistor of the first conductivity type and a fourth transistor of the second conductivity type, current paths of the third transistor and the fourth transistor being connected in series between the second high-voltage power supply and the second low-voltage power supply, a control terminal of the fourth transistor being connected to the current paths of the first and second transistors, and a control terminal of the second transistor being connected to the current paths of the third and fourth transistors.

5. The circuit according to claim 1, wherein the first load-reducing unit comprises a first transistor of a first conductivity type and a second transistor of a second conductivity type, current paths of the first transistor and the second transistor being connected in series between the first high-voltage power supply and the first low-voltage power supply.

6. The circuit according to claim 1, wherein the second load-reducing unit comprises a first transistor of a first conductivity type and a second transistor of a second conductivity type, current paths of the first transistor and the second transistor being connected in series between the second high-voltage power supply and the second low-voltage power supply.

7. The circuit according to claim 1, further comprising an input unit which inputs the first low-voltage power supply to an input of the output unit.

8. The circuit according to claim 7, wherein the input unit comprises a first transistor of a first conductivity type and a second transistor of a second conductivity type, current paths of the first transistor and the second transistor being connected in series between the second high-voltage power supply and the first low-voltage power supply.

9. The circuit according to claim 1, further comprising an input unit which inputs a signal that is based on the input signal to an input of the output unit.

10. The circuit according to claim 9, wherein the input unit comprises a first transistor of a first conductivity type and a second transistor of a second conductivity type, current paths of the first transistor and the second transistor being connected in series between the second high-voltage power supply and the first low-voltage power supply.

* * * * *